United States Patent
Chin et al.

(10) Patent No.: US 7,906,774 B2
(45) Date of Patent: Mar. 15, 2011

(54) PHASE CHANGE MEMORY DEVICE

(75) Inventors: Tsung-Shune Chin, Hsinchu County (TW); Chin-Fu Kao, Taipei (TW); Ming-Jinn Tsai, Hsinchu (TW); Chien-Min Lee, Hsinchu County (TW)

(73) Assignees: Industrial Technology Research Institute, Hsinchu (TW); National Tsing Hua University, Hsinchu (TW)

( * ) Notice: Subject to any disclaimer, the term of this patent is extended or adjusted under 35 U.S.C. 154(b) by 0 days.

(21) Appl. No.: 12/189,087

(22) Filed: Aug. 8, 2008

(65) Prior Publication Data

US 2009/0194759 A1 Aug. 6, 2009

Related U.S. Application Data

(60) Provisional application No. 61/025,379, filed on Feb. 1, 2008.

(51) Int. Cl.
*H01L 47/00* (2006.01)
*G11C 11/00* (2006.01)

(52) U.S. Cl. ............. 257/4; 257/E45.002; 257/E27.078; 257/E29.325; 365/163

(58) Field of Classification Search ............. 257/4, 298, 257/209, 296, 295, E45.002, 3, E27.078, 257/E29.325, E29.33; 438/129, 900; 365/163, 365/129, 46, 148

See application file for complete search history.

(56) References Cited

U.S. PATENT DOCUMENTS

| 7,321,130 | B2 | 1/2008 | Lung et al. | |
|---|---|---|---|---|
| 2005/0136209 | A1* | 6/2005 | Chin et al. | 428/64.4 |
| 2007/0109843 | A1 | 5/2007 | Lung et al. | |
| 2007/0190696 | A1* | 8/2007 | Happ | 438/128 |
| 2007/0272987 | A1* | 11/2007 | Kang et al. | 257/379 |

FOREIGN PATENT DOCUMENTS

CN 101101962 A 1/2008
WO WO 2004/057684 A1 7/2004

OTHER PUBLICATIONS

Yin et al., "Memory Effect in Metal- Chalcogenide -Metal Structure", 2006, Japanese Journal of Applied Physics, vol. 45, No. 6A, pp. 4951-4954).*
Lezal et al., "Chalcogenide glasses for optical and photonics applications", 2004, Chalcogenide Letters, vol. 1, No. 1, pp. 11-15.*

(Continued)

*Primary Examiner* — Thomas L Dickey
*Assistant Examiner* — Nikolay Yushin

(57) ABSTRACT

A phase change memory device is disclosed, including a substrate, a phase change layer over the substrate, a first electrode electrically connecting a first side of the phase change layer, a second electrode electrically connecting a second side of the phase change layer, wherein the phase change layer composes mainly of gallium (Ga), antimony (Sb) and tellurium (Te) and unavoidable impurities, having the composition range of $Ga_xTe_ySb_z$, $5<x<40$; $8 \leq y<48$; $42<z<80$; and $x+y+z=100$.

11 Claims, 13 Drawing Sheets

OTHER PUBLICATIONS

Moharram et al., "Pre-crystallization and crystallization kinetics of some Se-Te-Sb glasses", 2002, Physica B, vol. 324, pp. 344-351.*
(see chalcogenide (1992) in Academic Press Dictionary of Science and Technology. Retrieved from http://www.credoreference.com/entry/apdst/chalcogenide).*
Yamada et al., "Rapid-Phase Transitions of GeTe-$Sb_2$-$Te_3$ Pseudobinary Amorphous Thin Films for an Optical Disk Memory," J. Appl. Phys. 69 (5), Mar. 1, 1991, pp. 2849-2856, American Institute of Physics, US.

Huai-Yu Cheng et al., "Characteristics of Ga-Sb-Te Films for Phase-Change Memory," IEEE Transactions on Magnetics, Feb. 2007, vol. 43, No. 2, IEEE, US.
Xiu-Lan Cheng., "Simulation on A Novel Ga-doped Phase Change Memory for Next Generation Embedded Non-Volatile Memory Applicaiton," IEEE/SEMI Advanced Semiconductor Manufacturing Conference, May 2008, P. 43-48, IEEE, US.

* cited by examiner

PHASE CHANGE MEMORY DEVICE

CROSS REFERENCE TO RELATED APPLICATIONS

This application claims the benefit of U.S. Provisional Application No. 61/025,379, filed on Feb. 01, 2008, the entirety of which is incorporated by reference herein.

BACKGROUND

1. Field of the Invention

The invention relates to a phase change memory device, and more particularly relates to a phase change memory material of a phase change memory device.

2. Description of the Related Art

Phase change memory has many advantages, such as fast speed, lower power consumption, high capacity, robust endurance, easy embeddability in logic IC, and lower cost, so that it can serve as a stand-alone or embedded memory device with high integrity. Due to the described advantages, phase change memory has been considered the most promising candidate for the next-generation nonvolatile semiconductor memory which may replace the commercialized volatile memory, such as SRAM or DRAM, and non-volatile memory, such as flash.

Chalcogenide is widely used in phase change memory devices. The chemical element of group VI, such as S, Se or Te, is the major material of Chalcogenide and is combined with elements of group IV or V and some dopants for use in phase change memory devices. $Ge_2Sb_2Te_5$ is the most popular material used in phase change memory devices because it can provide a binary state switching with a fast and reversible phase transition between an amorphous phase (with extremely high electrical resistivity) and a crystalline phase (with very low electrical resistivity). $Ge_2Sb_2Te_5$, however, still has deficiencies which include low crystallization temperature, low electrical resistivity at crystalline state while high melting temperature, containing major amount of Te which is highly volatile and toxic to easily contaminate the processing chamber and its environment, among others. A novel phase change material is required to promote performance of phase change memory devices, as well as to lessen the burden to environment.

BRIEF SUMMARY OF INVENTION

According to the issues described previously, an embodiment of the invention provides a phase change memory device, comprising a substrate, a phase change layer over the substrate, a first electrode electrically connecting a first side of the phase change layer, and a second electrode electrically connecting a second side of the phase change layer, wherein the phase change layer composes mainly of gallium (Ga), tellurium (Te), antimony (Sb), and unavoidable impurities, having the composition range of $Ga_xTe_ySb_z$, $5<x<40$; $8 \leq y<48$; $42<z<80$; and $x+y+z=100$.

The invention further provides a phase change memory device, comprising a substrate, a phase change layer over the substrate, a first electrode electrically connecting a first side of the phase change layer, and a second electrode electrically connecting a second side of the phase change layer, wherein the phase change layer has two states of a stable phase.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense, not for limiting the invention.

Conventional chalcogenide-based phase change material, $Ge_2Sb_2Te_5$, has many advantages, such as high electrical resistance difference and high crystallization speed, but it has many deficiencies required to be improved.

Figure 1:
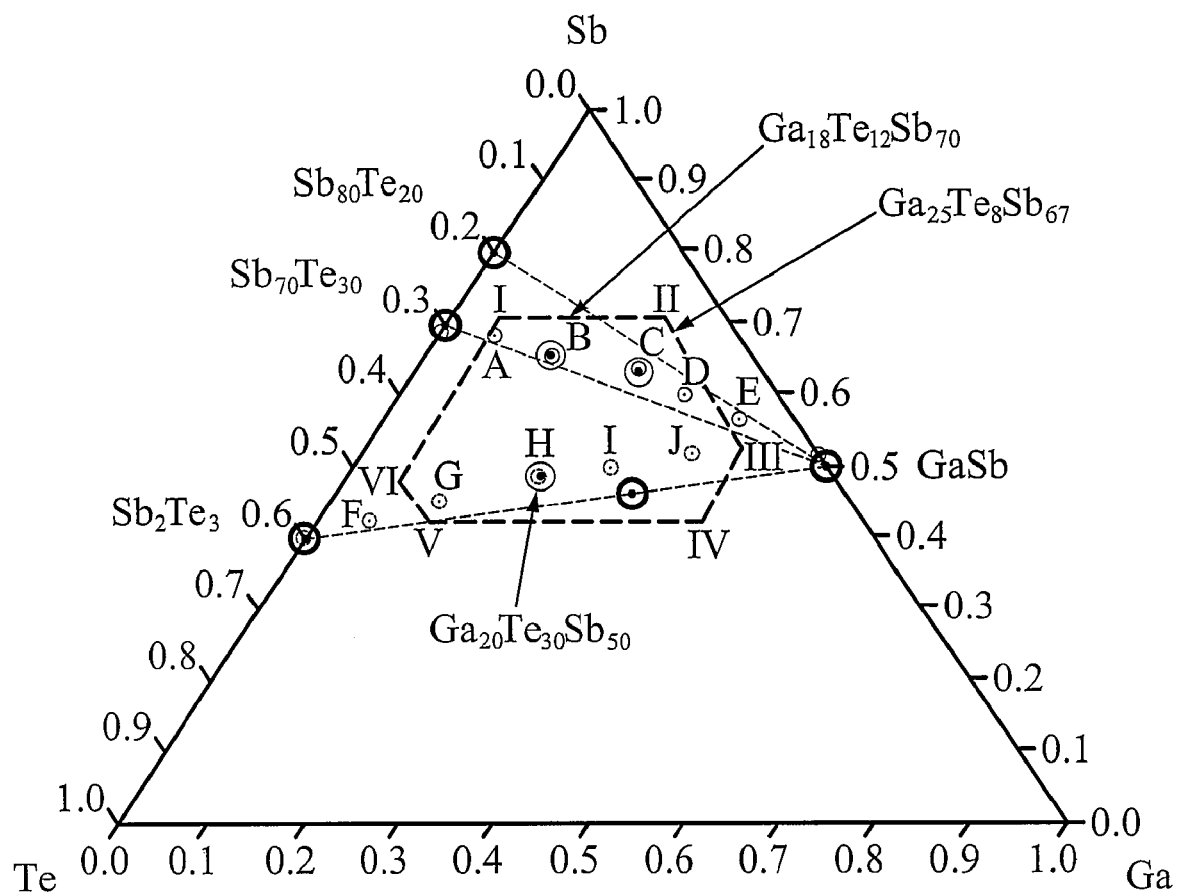
FIG. 1 shows the designed and studied alloy compositions of the phase change material of an embodiment of the invention.

The designed and studied alloy compositions of the phase change material of an embodiment of the invention are shown by the area bounded by points I, II, III, IV, V and VI in FIG. 1. There are two series of compositions: A, B, C, D, and E along the $Sb_{80}Te_{20}$—GaSb tie-line (tie line 1), and compositions F, G, H, I, and J along the $Sb_2Te_3$—GaSb tie line (tie line 2). All of them can be represented by the formulae:

$Ga_xTe_ySb_z$ $5<x<40$; $8 \leq y <48$; $42<z <80$, and $x+y+z=100$; whereas three Reference compositions located at $x=20$, $y=30$, $z=50$; $x=18$, $y=12$, $z=70$; and $x=25$, $y=8$, $z=67$ were designed to represent $Ga_{20}Te_{30}Sb_{50}$, $Ga_{17.6}Te_{11.8}Sb_{70.6}$ and $Ga_{25}Te_8Sb_{67}$, respectively.

Any methods known in the prior art can be used in the preparation of the designed alloys, and a target for forming a layer of the designed alloys of the present invention. Any deposition methods known in the prior art can be used to form the phase change layer of the phase change memory device of the present invention, which include (but are not limited to): evaporation methods in vacuum such as thermal evaporation and E-beam evaporation; sputtering methods such as DC, RF, magnetron, symmetric, and non-symmetric sputtering, etc.; and vacuum ion plating. In addition, any chemical vapor deposition methods known in the prior art can also be used to deposit the phase change memory alloys. In the embodiments shown below, magnetron sputtering was adopted for the deposition of films. Two targets were used simultaneously, GaSb and $Sb_{80}Te_{20}$ for the compositions along tie line 1 (compositions A to E), while GaSb and $Sb_2Te_3$ were used for the compositions along tie line 2 (compositions F to J). Film composition was tuned and adjusted by the respective sputtering power of the targets.

TABLE 1

| Power Ratio, W | (Composition %) | | | | Specific temperatures (° C.) | | |
|---|---|---|---|---|---|---|---|
| | | Ga | Sb | Te | Sb/Te | $T_x$ | $T_{m-1}$ | $T_{m-2}$ |
| 0/50 | S8T2 | 0 | 82.1 | 17.9 | 4.59 | 123 | 541 | — |
| 25/50 | A | 9.9 | 75.7 | 14.4 | 5.26 | 195 | 513.9 | 559.5 |
| 50/50 | B | 17.1 | 71.2 | 11.7 | 6.08 | 232 | 573.6 | — |
| 50/25 | C | 26.4 | 65.2 | 8.4 | 7.76 | 277 | 567.5 | — |
| 75/25 | D | 31.6 | 62.1 | 6.3 | 9.86 | 269 | 567.3 | 666.5 |
| 75/15 | E | 38.2 | 57.7 | 4.1 | 14.4 | 275 | 564.9 | 686.8 |
| 50/0 | GS | 51.4 | 48.6 | 0 | — | 275 | 564.5 | 687.1 |

Table 1 is the quantitative analysis results of the films under study. The designation S8T2 represents $Sb_{80}Te_{20}$, and GS for GaSb. They were prepared as References, and the compositions of A to E are denoted in this table.

Figure 2:
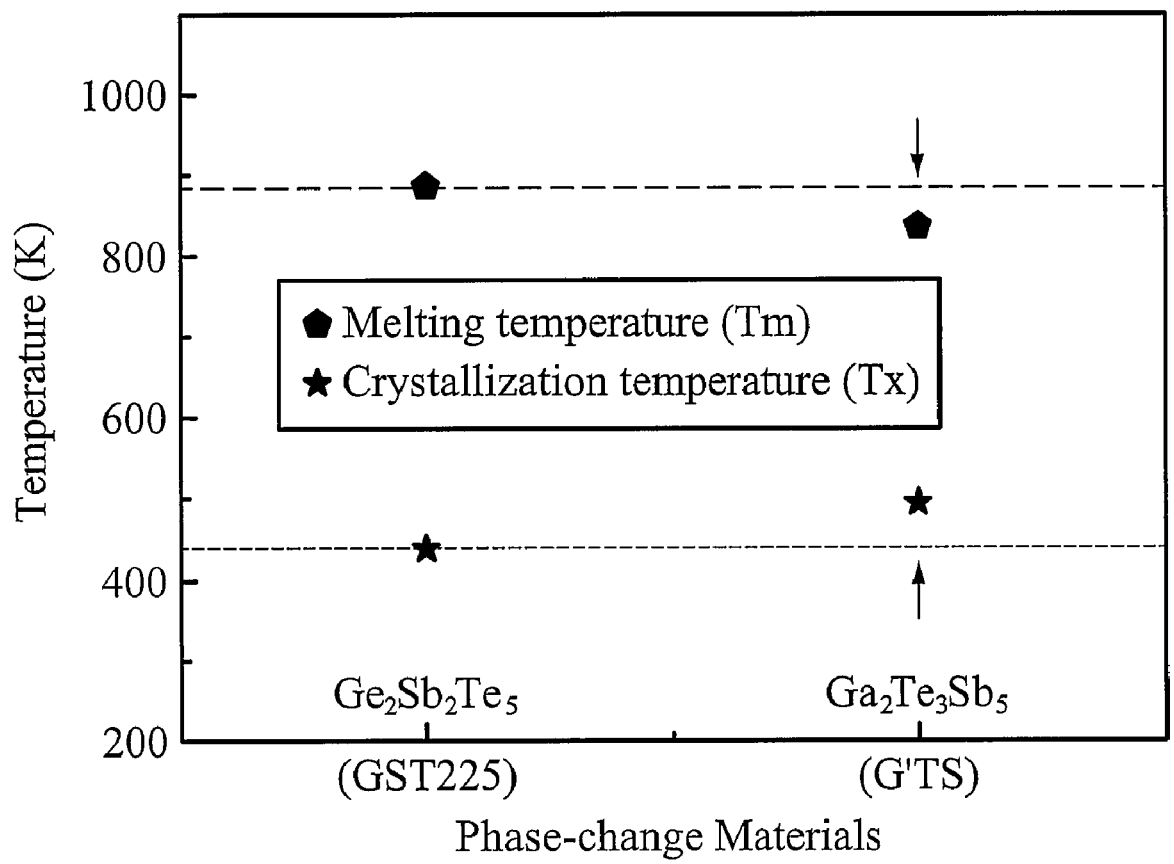
FIG. 2 shows comparison of melting temperature and crystallization temperature of the sample $Ga_{20}Te_{30}Sb_{50}$ with a conventional $Ge_2Sb_2Te_5$.

In the embodiment, the Ge of $Ge_2Sb_2Te_5$ is replaced by Ga, wherein Ga has an atomic number is only 1 less than that of Ge. Hence, Ga has a similar atom radius with Ge; and lattice arrangement can be stable upon this replacement. Further, as shown in FIG. 2, since the melting temperature of Ga is only 29.8° C., melting temperature of the alloy ($Ga_{20}Te_{30}Sb_{50}$) can be effectively reduced to decrease operation energy of the device and to eliminate thermal cross-talk issues for smaller feature-sized devices.

Figure 3:
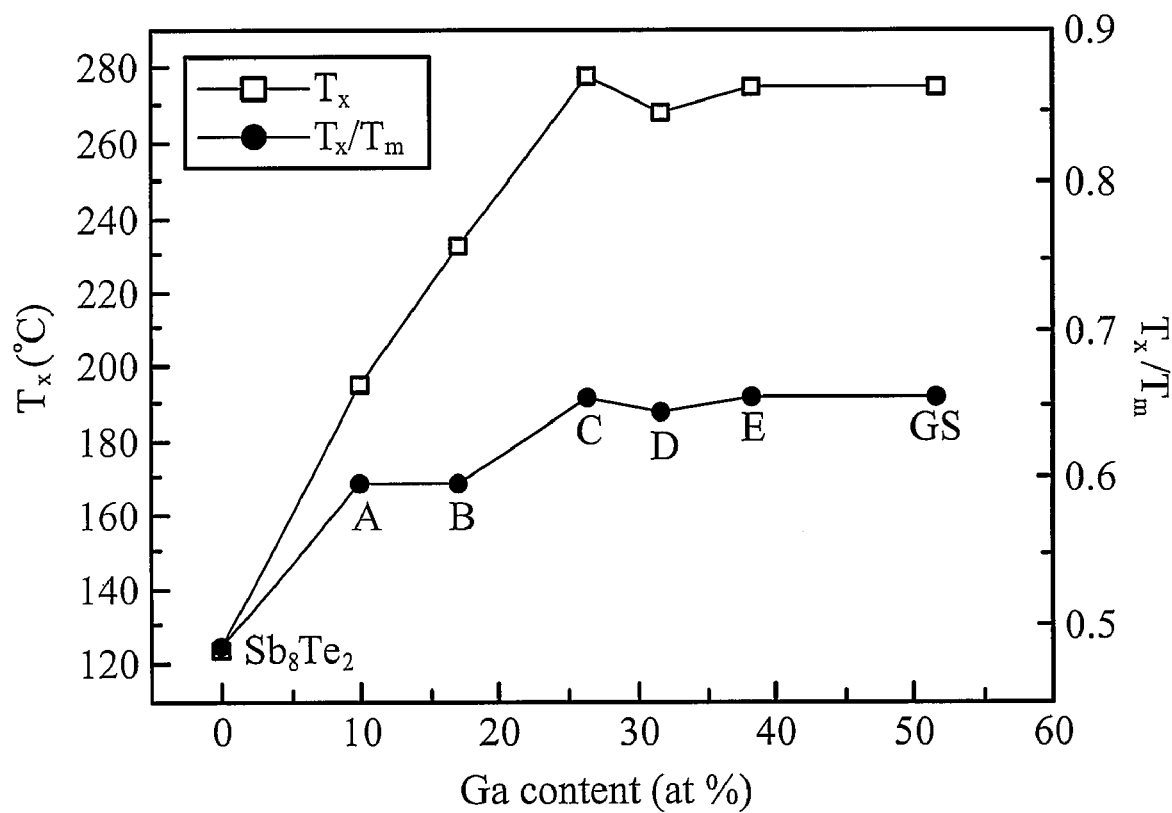
FIG. 3 shows crystallization temperature and the ratio between crystallization temperature and melting temperature ($T_x/T_m$) of the studied alloys of an embodiment of the invention.

FIG. 3 shows crystallization temperature of the studied alloys. When the Ga content is increased, the crystallization temperature ($T_x$) and the ratio between crystallization temperature and melting temperature ($T_x/T_m$) of the alloys are increased, which means that the Ga—Te—Sb alloy provided good thermal stability.

Figure 4:
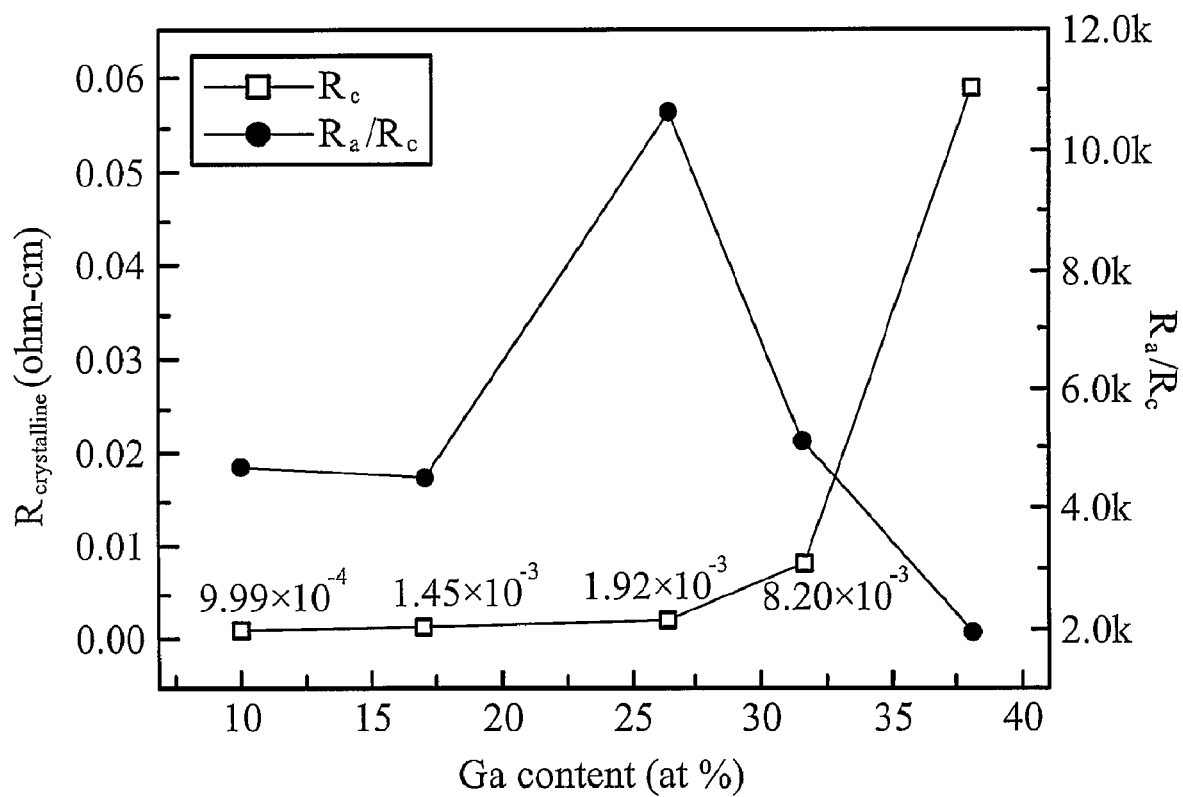
FIG. 4 shows electrical resistance after crystallization of the studied alloys.

FIG. 4 shows electrical resistance after crystallization of the as-deposited amorphous alloys. When the Ga content is increased in a specific range, crystallized resistance ($R_c$) and the ratio between electrical resistance of amorphous and crystalline state ($R_a/R_c$) of the alloys are increased. The higher electrical resistance at crystalline state provided by the Ga—Te—Sb alloy can reduce RESET current of the phase change memory device, and size of the device can be reduced and numbers of unit cell per area can be increased.

Figure 5:
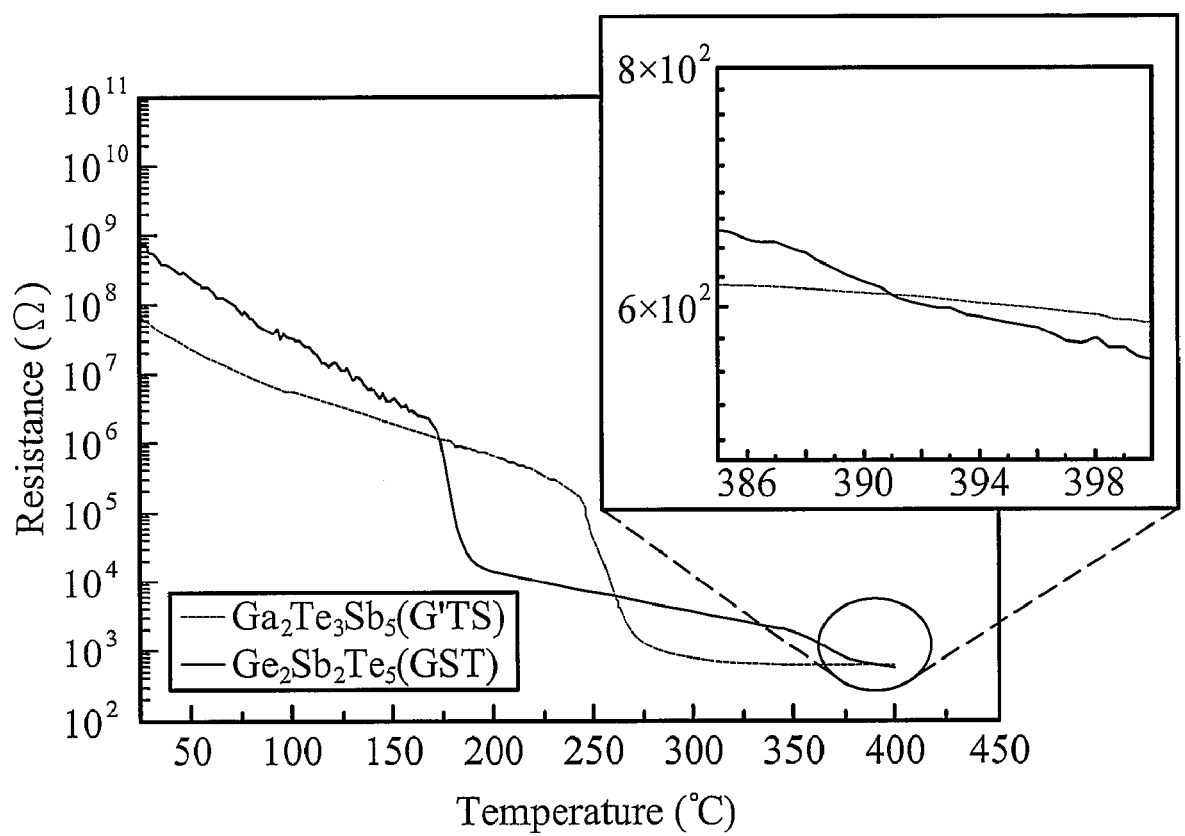
FIG. 5 shows electrical resistance as a function of temperature of the example ($Ga_{20}Te_{30}Sb_{50}$) and a conventional $Ge_2Te_2Sb_5$ alloy films.

FIG. 5 shows electrical resistance as a function of temperature of the example ($Ga_{20}Te_{30}Sb_{50}$) and conventional $Ge_2Te_2Sb_5$. This figure shows that conventional $Ge_2Sb_2Te_5$ has a first phase change at about 170° C. and a second phase change at about 300° C., and it is clear that the resistance is sensitive to variation of temperature between the first and second phase change points. This phenomenon may lead to resistance variation due to residue heat during operation of the device, thus the stability of the device is affected. In contrast, the sample ($Ga_{20}Te_{30}Sb_{50}$) of the invention presents stable crystallized electrical resistance, which is not greatly changed when temperature is increased.

Figure 6:
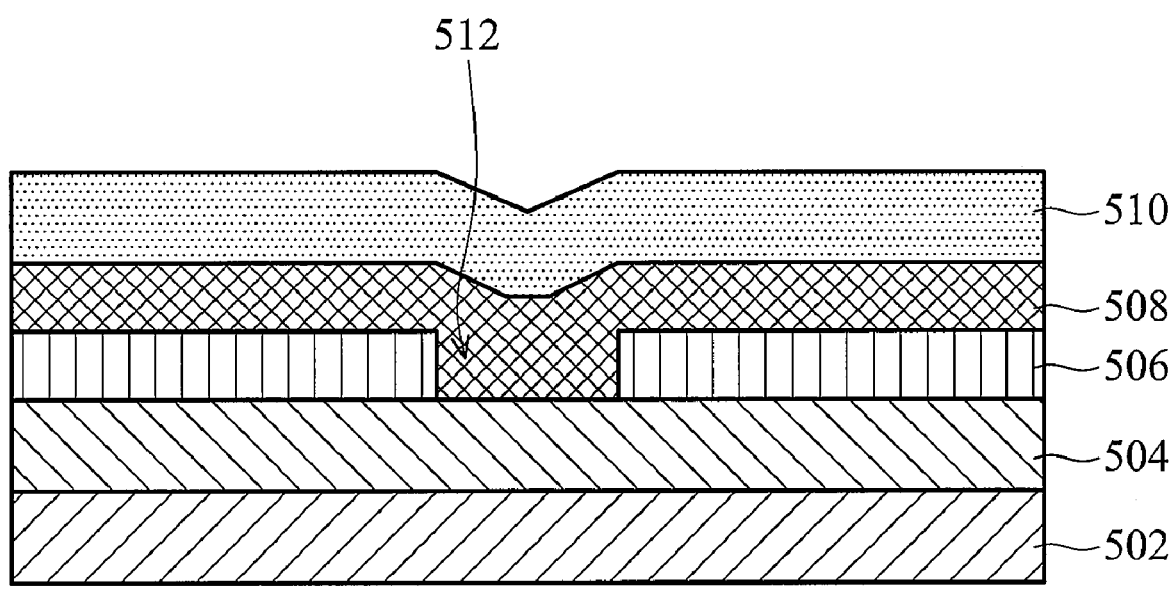
FIG. 6 shows fabrication of a phase change memory device using Ga—Te—Sb alloy as a phase change material of an embodiment of the invention.

Fabrication of a phase change memory device using a demonstrating Ga—Te—Sb alloy as a phase change material and a $Ge_2Sb_2Te_5$ material for REFERENCE, with cell-size of 200 nm×200 nm is illustrated in accordance with FIG. 6. A substrate 502, such as silicon, is provided, and a buffer layer (not shown), such as silicon oxide can be formed on the substrate 502. A bottom electrode 504 is deposited over the substrate 502, in which the bottom electrode 504, in this case comprises of a TiN layer with thickness of about 50 nm and a Ti layer with thickness of about 150 nm. The bottom electrode 504 is patterned by photolithography technology to define a contact area. An insulating layer 506, such as an oxide, is formed on the bottom electrode 504 and then patterned to form an opening 512. A phase change layer 508, which includes Ga—Te—Sb alloy, or reference $Ge_2Sb_2Te_5$, and is about 100 nm thick, is deposited on the insulating layer 506 and filled into the opening 512. Next, a top electrode 510, such as TaN, is formed on the phase change layer 508, followed by placing the device into a furnace for annealing the phase change layer 508 to change it into crystalline state.

Figure 7:
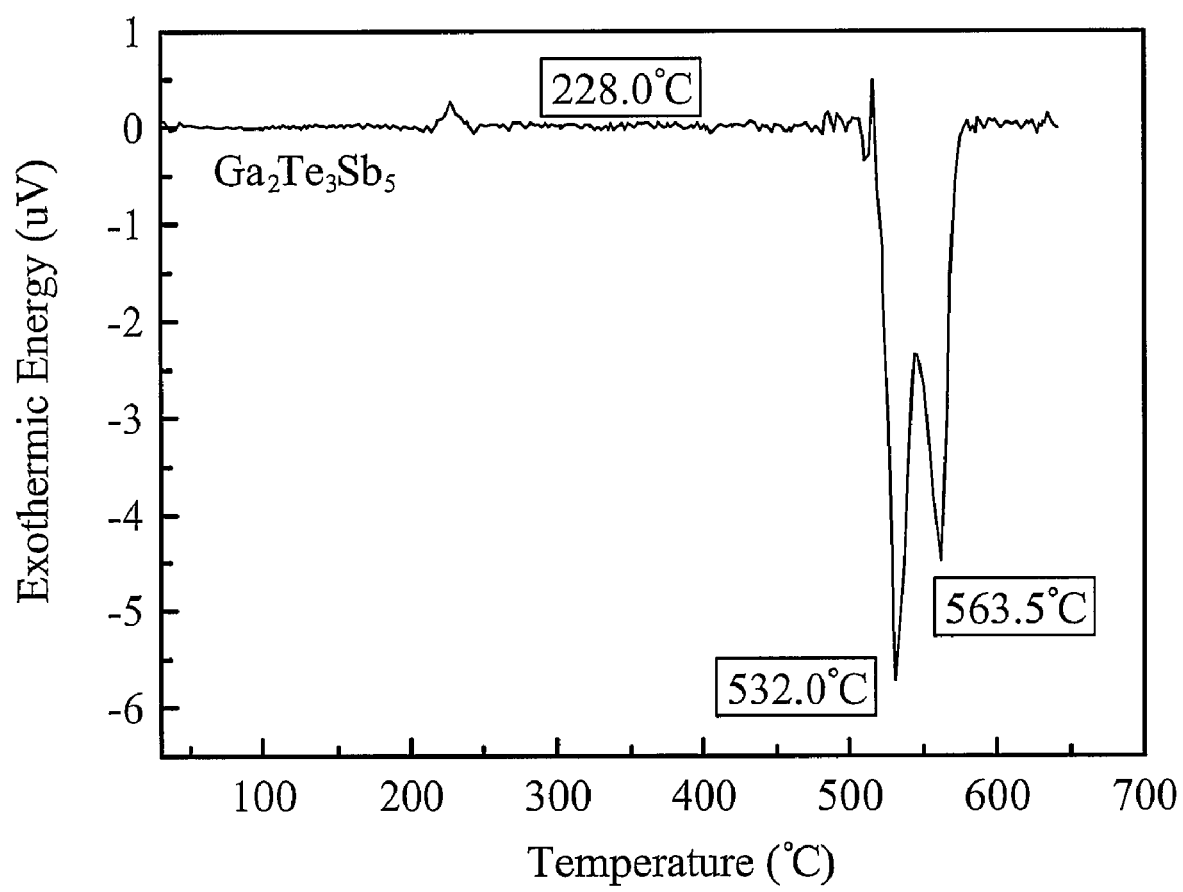
FIG. 7 shows a thermogram taken using a DTA during heating up of the amorphous $Ga_{20}Te_{30}Sb_{50}$ sample of the embodiment of the invention.
Figure 8:
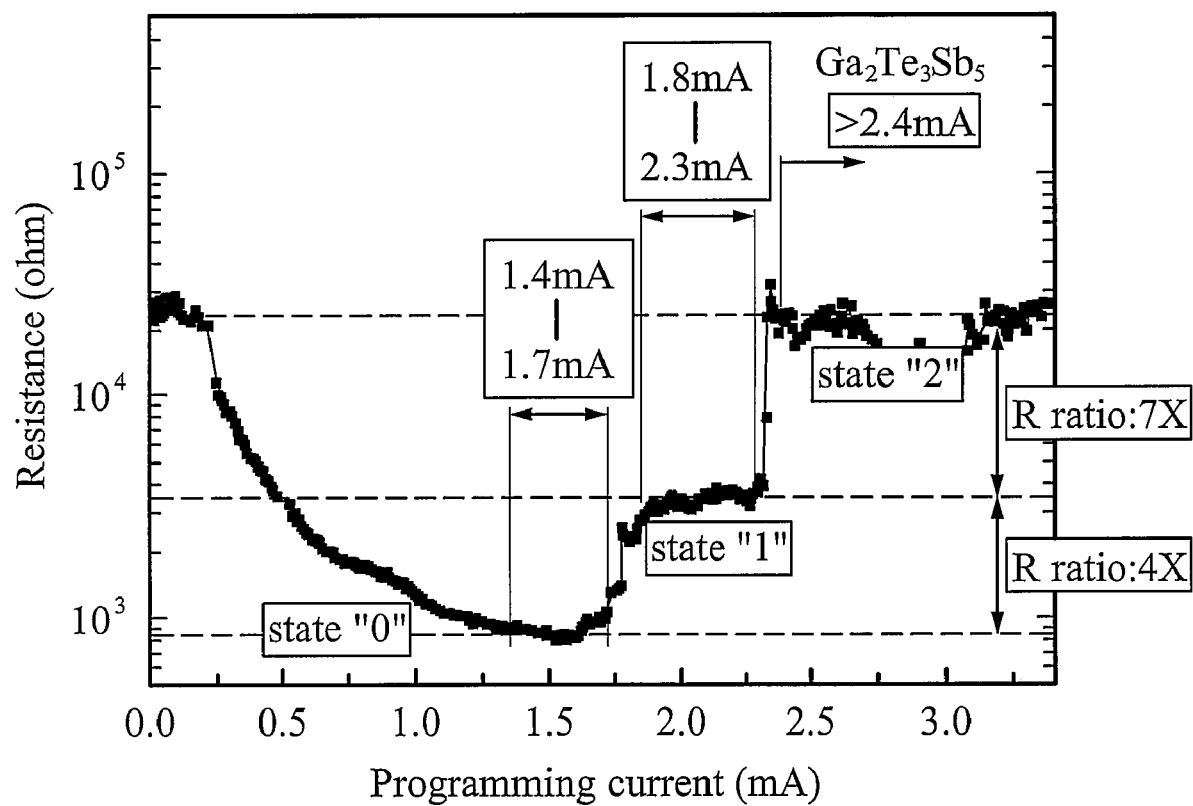
FIG. 8 shows electrical resistance as a function of programming current of a memory device made of $Ga_{20}Te_{30}Sb_{50}$ sample of the embodiment of the invention.

FIG. 7 shows the thermogram obtained using differential thermo-analysis (DTA) during heating up of a $Ga_{20}Te_{30}Sb_{50}$ film sample of the embodiment of the invention. It is noted that the phase change material has an incongruent melting. Due to this characteristic, thise phase change $Ga_{20}Te_{30}Sb_5O$ material has two endothermic peaks in a DTA or differential scanning calorimetry (DSC) analysis, as shown in the DTA curve of FIG. 7. Accordingly, as shown in FIG. 8, which shows resistance as a function of programming current, the phase change material has two states of stable phases (state 1 and state 2). This is due to the fact that the material has two endothermic peaks. When the material is applied with current to a specific temperature, the first incongruent composition is melted to form a transient liquid which is subsequently quenched by the surrounding into an amorphous phase, a fraction of the cell volume. This firstly formed amorphous phase mixes with the remaining crystalline phase in the cell forming a metastable intermediate state which has an electrical resistance higher than that of the crystalline state, but less than that of the amorphous state. Due to the intermediate electrical resistance state, this phase change material can have an extra memory bit per cell. That is to say, the invented phase change material has the capability to memorize three bits per cell. For example, the memory device using the phase change material can have three bits (0, 1, 2) and the memory capacity can be increased from the conventional $2^n$ to $3^n$.

TABLE 2

| | $T_x$ (° C.) | $T_m$ (° C.) | $T_x/T_m$ | $R_c$ (Ω-cm) | $R_a/R_c$ |
|---|---|---|---|---|---|
| $Ge_2Sb_2Te_5$ | 157 | 613 | 0.485 | 3.0e−3 | 2.5e5 |
| $Ga_{20}Te_{30}Sb_{50}$ | 237 | 563 | 0.61 | 6.5e−3 | 4.4e4 |
| $Ga_{18}Te_{12}Sb_{70}$ | 232 | 573.6 | 0.596 | 1.45e−3 | 6.8e3 |
| $Ga_{25}Te_8Sb_{67}$ | 277 | 567.5 | 0.65 | 1.9e−3 | 1.1e4 |

Table 2 shows comparisons among a conventional $Ge_2Sb_2Te_5$ and the three examples $Ga_{20}Sb_{30}Te_{50}$, $Ga_{18}Te_{12}Sb_{70}$ and $Ga_{25}Te_8Sb_{67}$ of the invention. According table, the sample $Ga_{20}Te_{30}Sb_{50}$ presents higher electrical resistance at crystalline state ($R_c$) than that of a conventional $Ge_2Sb_2Te_5$ to reduce RESET current of the phase change memory device. The high crystallization temperature and $T_x/T_m$ renders less problems encountered by the conventional $Ge_2Sb_2Te_5$, so that size of the device can be reduced and numbers of memory cells per unit area can be increased. In addition, Table 2 also shows that the three examples have much higher $T_x/T_m$ to have much better thermal stability. The other two exemplified compositions, $Ga_{18}Te_{12}Sb_{70}$ and $Ga_{25}Te_8Sb_{67}$, have $R_c$ values close to that of the $Ge_2Sb_2Te_5$ while have lower melting temperatures to reduce the energy required for the transient melting (RESET) the memory cells. Hence are applicable for use in high-density phase change memory.

Figure 9A:
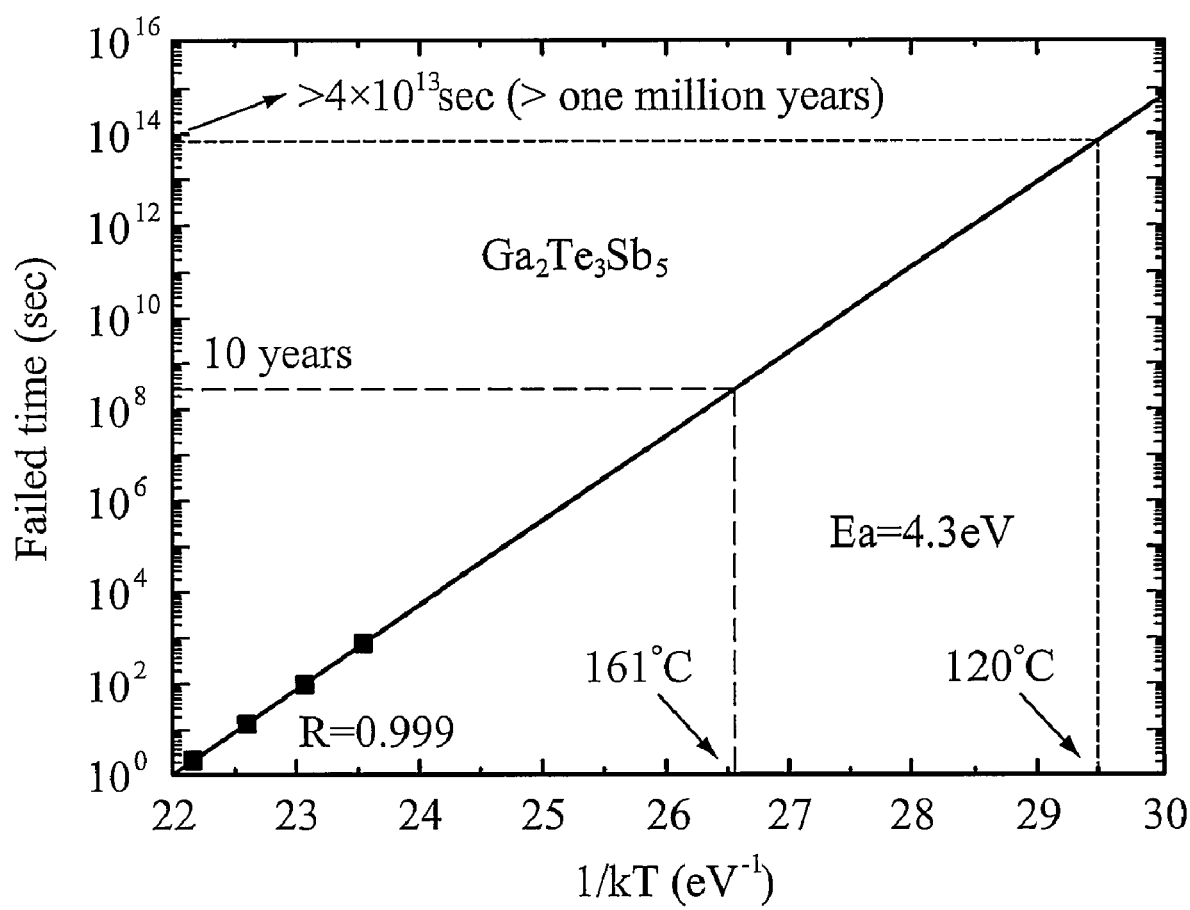
FIG. 9A and FIG. 9B show failure time as a function of $1/kT$ to compare data retention of the memory devices made of $Ga_{20}Te_3Sb_{50}$ (A) with that made of the conventional $Ge_2Sb_2Te_5$ (B).
Figure 9B:
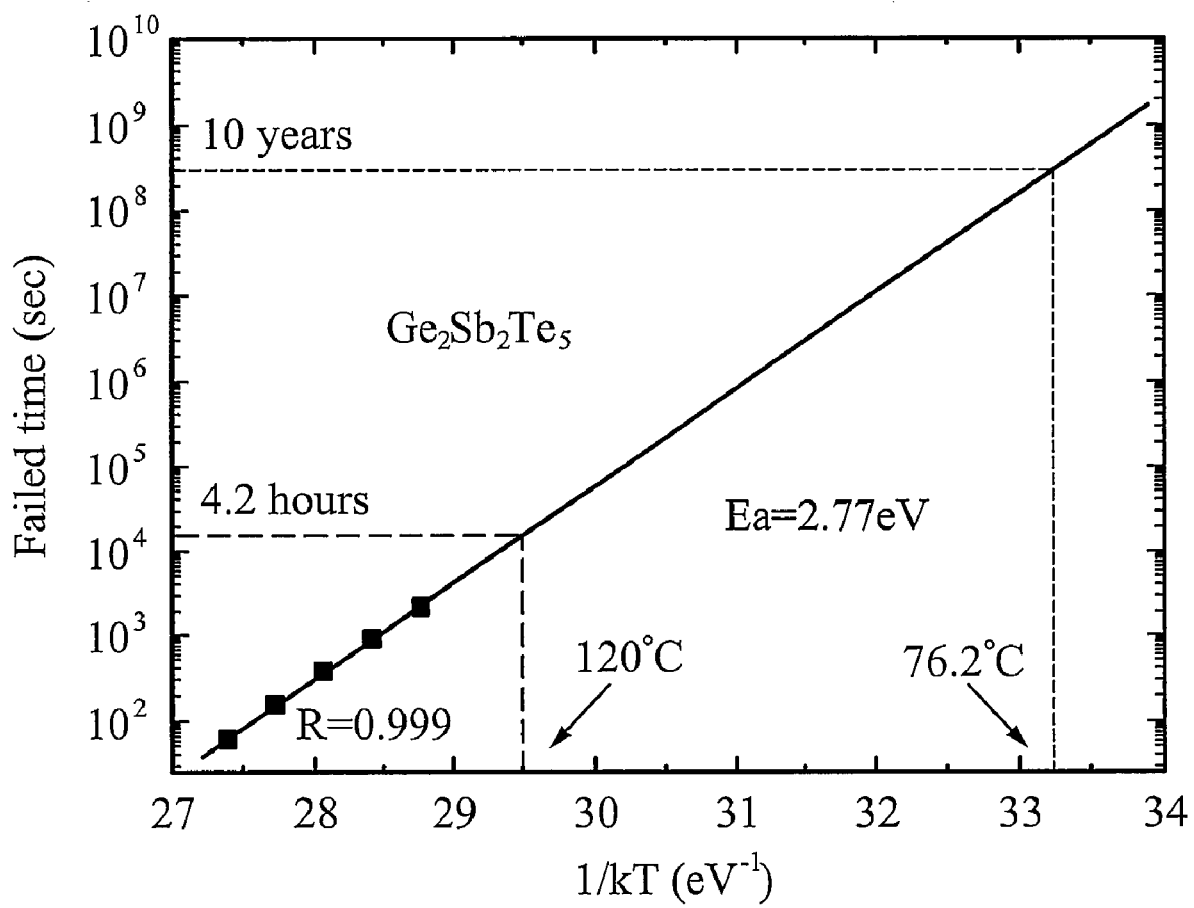

FIG. 9A and FIG. 9B show failure time as function of 1/kT to compare data retention of the sample $Ga_{20}Te_{30}Sb_{50}$ with a conventional $Ge_2Sb_2Te_5$. As shown in FIG. 9A and FIG. 9B, since $Ga_{20}Te_{30}Sb_{50}$ has higher activation energy, which is proportional to the barrier energy between the amorphous state and the crystal state, devices with the material of the example can keep data extrapolating to more than one million years under the temperature of 120° C. However, devices with a conventional $Ge_2Sb_2Te_5$ can keep data for only 4.2 hours under the same condition. Hence, the phase change material of the embodiment of the invention has very good data retention characteristics.

TABLE 3

| Pulse width (ns) | Rset (Ω) | ΔR = Rreset − Rset (Ω) | Normalized vs. DR500 ns | Percentage (%) |
|---|---|---|---|---|
| 20 | 2046 | 14423 | 0.920299 | 92.0 |
| 40 | 1318 | 15150 | 0.966728 | 96.7 |
| 60 | 1109 | 15360 | 0.980081 | 98.0 |
| 80 | 1020 | 15448 | 0.985739 | 98.6 |
| 100 | 964 | 15504 | 0.989308 | 98.9 |
| 300 | 856 | 15612 | 0.996204 | 99.6 |
| 500 | 797 | 15671 | 1 | 100 |

Figure 10A:
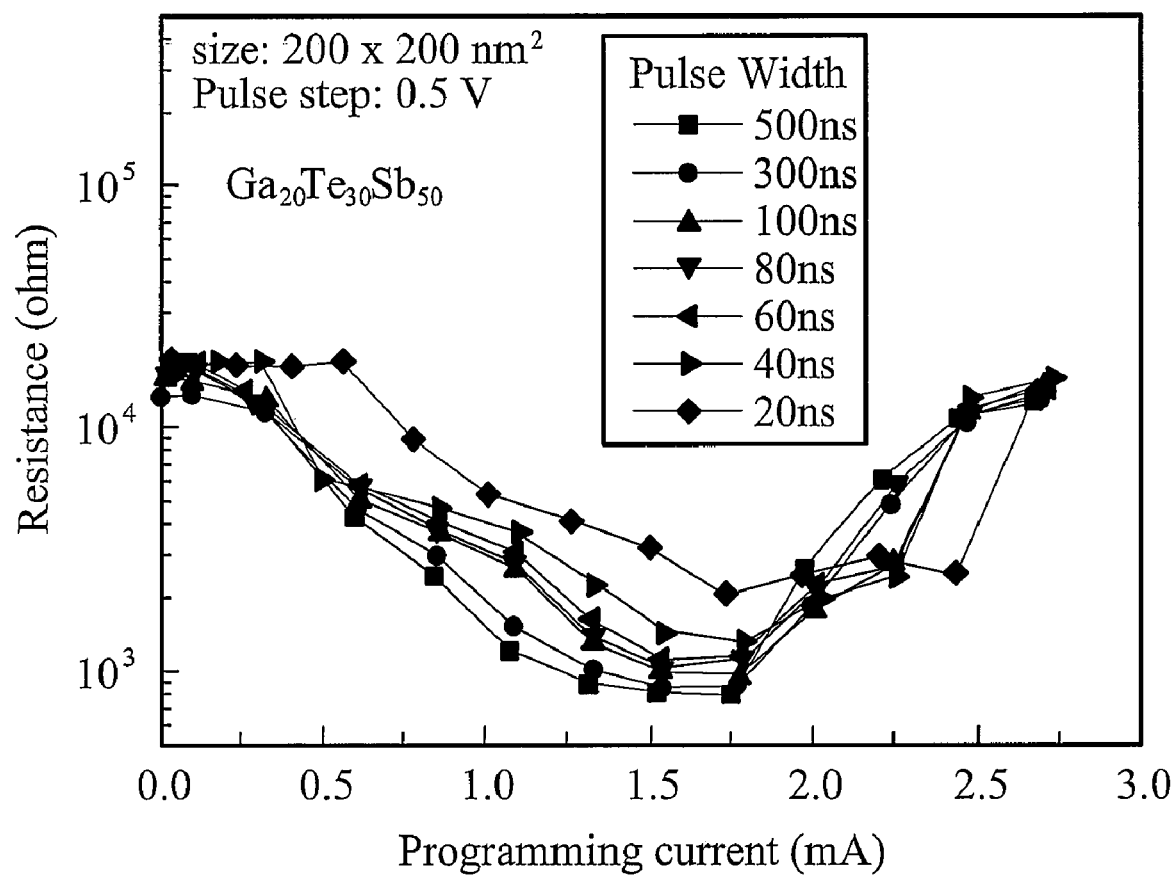
FIG. 10A shows resistance as a function of programming current of an example ($Ga_{20}Te_{30}Sb_{50}$).
Figure 10B:
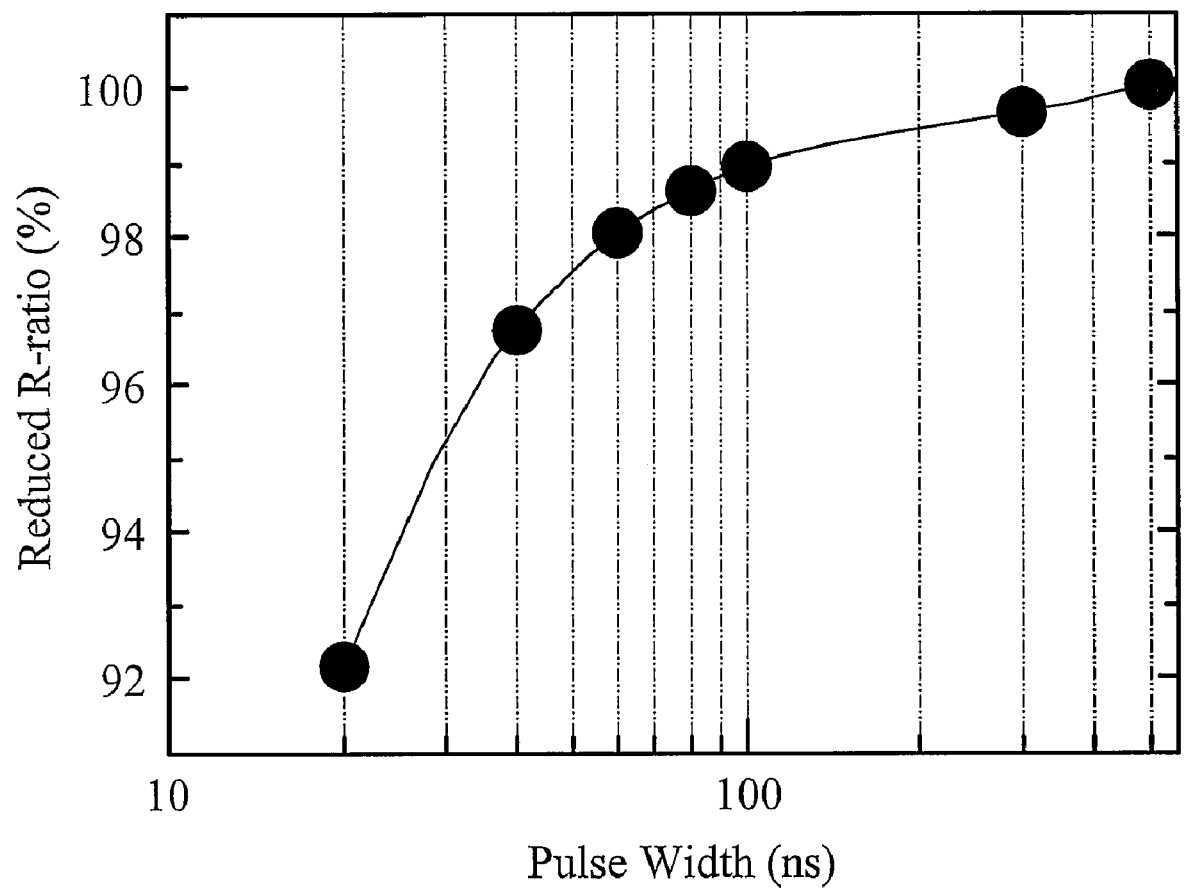
FIG. 10B shows reduced R-ratio as a function of pulse width of an example ($Ga_{20}Te_{30}Sb_{50}$).

Table 3 is an analysis of programming speed of the example ($Ga_{20}Te_{30}Sb_{50}$) applied with pulse width from 20 ns to 500 ns. The resistance as a function of programming current of the example ($Ga_{20}Te_{30}Sb_{50}$) is shown in FIG. 10A. In table 3, Rset is measured under various pulse-width conditions and average reset resistance of the example reset by pulse widths from 20 ns~500 ns is calculated as 16468Ω. ΔR is calculated with average reset resistance Rreset (16468Ω) subtracted from Rset. The ΔR (15671) of 500 ns pulse-width condition is set as a base to compare ΔR of various pulse-width conditions to the ΔR of 500 ns pulse-width condition. The result is shown in the final column of table 3 and charted as FIG. 10B. According to table 3 and FIG. 10B, we can see that the example ($Ga_{20}Te_{30}Sb_{50}$) applied with 20 ns pulse width can achieve about 92% resistance difference between reset and set condition comparing that applied with 500 ns pulse width. Therefore, the example of the invention having very fast programming speed is concluded.

Figure 11:
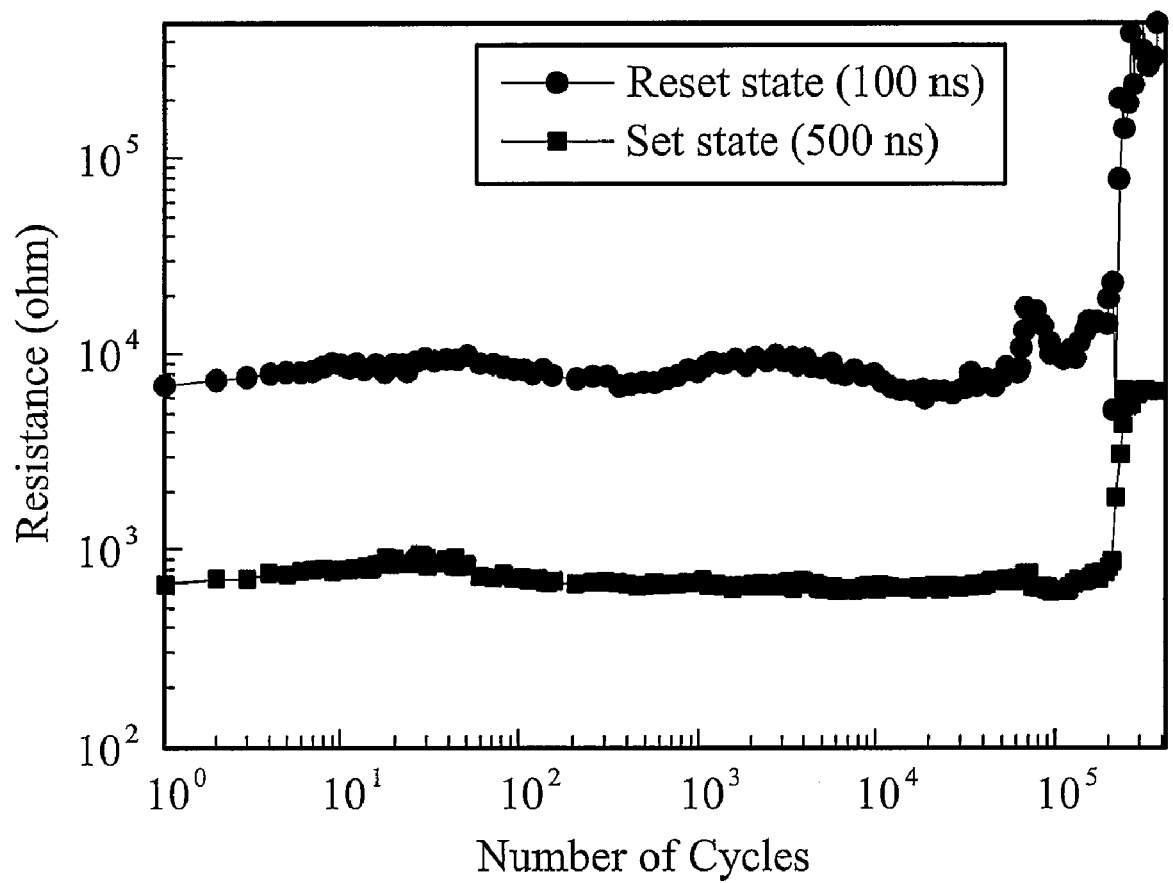
FIG. 11 shows resistance as a function of number of cycles of the example ($Ga_{20}Te_{30}Sb_{50}$).

FIG. 11 shows resistance as a function of number of cycles of the example ($Ga_{20}Te_{30}Sb_{50}$). As shown FIG. 11, the example can achieve a cycle number greater than $2 \times 10^5$ and this result shows that the example has good endurance performance.

The merits of phase-change memory device using the Ga—Te—Sb materials disclosed in this invention are manifest. First of all, they have a reasonably higher crystallization temperature ($T_x$) while lower melting temperature than state-of-the-art $Ge_2Sb_2Te_5$ alloys. This leads right away to the benefits of less cross-talk problems, while lower energy to RESET, the device of this invention. Second, the phase-change materials disclosed in this invention have both high Tx and activation energy, resulting in memory devices which has much higher thermal stability and can be operative at a temperature 161° C. for 10 years. Third, memory devices with three bits per cell are possible in the some compositions of this invention, leading to much higher memory capacity at the same feature size. Fourth, the phase-change materials disclosed in this invention contain much less Te, hence a cleaner process and less impact to the environmental burden that that of $Ge_2Sb_2Te_5$ alloys can be expected.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase change memory device, comprising:
a substrate;
a phase change layer over the substrate;
a first electrode electrically connecting a first side of the phase change layer; and
a second electrode electrically connecting a second side of the phase change layer,
wherein the phase change layer composes mainly of gallium (Ga), antimony (Sb) and tellurium (Te) and unavoidable impurities, having the composition range of $Ga_xTe_ySb_z$ $5 < x < 40$; $8 < y < 48$; $42 < z < 80$, wherein $x+y+z=100$, and
the phase change layer in the said device is characteristic of:
reversible phase change between amorphous and crystalline states upon a pulsed electrical current of appropriate amplitude and duration flowing through the first and second electrodes,
wherein the phase change memory device has two reset states and a three-digit per cell memory characteristics.

2. The phase change memory device as claimed in claim 1, wherein the phase change layer composes of Ga-Te-Sb in the range of $Ga_{15-25}Te_{10-32}Sb_{50-72}$.

3. The phase change memory device as claimed in claim 1, wherein the phase change layer presents stable electrical resistance at amorphous state when temperature is increased to not less than 200° C.

4. The phase change memory device as claimed in claim 1, wherein the phase change layer presents a melting temperature lower than 600° C.

5. The phase change memory device as claimed in claim 1, further comprising an insulating layer with an opening between the first electrode and the phase change layer, and the phase change layer is filled into the opening.

6. The phase change memory device as claimed in claim 1, wherein the electrical resistance ratio between amorphous and crystalline states is higher than 10.

7. The phase change memory device as claimed in claim 1, wherein the amplitude of said appropriate electric current is not larger than 10 mA.

8. The phase change memory device as claimed in claim 1, wherein the duration of said appropriate electrical current is not longer than 500 ns.

9. A phase change material composes mainly of gallium (Ga), antimony (Sb) and tellurium (Te) and unavoidable impurities, having the composition range of $Ga_xTe_ySb_z$ wherein, $5 < x < 40$; $8 < y < 48$; $42 < z < 80$, and $x+y+z=100$; and
thin film made of the said $Ga_xTe_ySb_z$ is capable of reversible phase-transition between an amorphous phase and its crystalline counterpart upon applying pulsed currents of different amplitudes and durations, wherein the phase change material has the capability of multi-bits per cell memory.

10. The phase-change material claimed in claim 9 wherein the resistance ratio between amorphous and crystalline phases is at least 1000 and higher.

11. The phase change memory material as claimed in claim 9, wherein the phase change memory device prepared thereof has two reset states and three-digit per cell memory characteristics.

* * * * *